United States Patent [19]

Gross

[11] 4,355,343

[45] Oct. 19, 1982

[54] SEMICONDUCTOR SWITCH FAILURE CONTROL CIRCUIT

[75] Inventor: Thomas A. O. Gross, Lincoln, Mass.

[73] Assignee: Jet Spray Corp., Waltham, Mass.

[21] Appl. No.: 150,201

[22] Filed: May 15, 1980

[51] Int. Cl.³ ............................................... H02H 3/00
[52] U.S. Cl. ................................. 361/100; 307/252 B; 307/252 N; 323/351; 361/58
[58] Field of Search .................... 361/100, 156, 58; 323/312, 349, 351; 307/252 B, 252 M, 252 N, 200 A, 98

[56] References Cited

U.S. PATENT DOCUMENTS

| | | | |
|---|---|---|---|
| 3,493,783 | 2/1970 | Till | 307/252 B |
| 3,553,495 | 1/1971 | Shaugnessy | 307/252 B X |
| 3,737,744 | 6/1973 | Bader, Jr. | 307/252 B X |
| 3,855,482 | 12/1974 | Wills | 307/252 N X |

Primary Examiner—Reinhard J. Eisenzopf
Attorney, Agent, or Firm—Wolf, Greenfield & Sacks

[57] ABSTRACT

A bidirectional semiconductor switch such as a Triac in the usual failure mode, wherein the device conducts continuously in only one direction, has a storage circuit in series intermediate the triac and load. The storage circuit may comprise a single capacitor preferably of predetermined value and adapted to, after a relatively short time-out period, interrupt power applied to the load. The capacitor is preferably a non-polar type, although, in an alternate embodiment a pair of oppositely-poled polar capacitors may be employed.

14 Claims, 4 Drawing Figures

SEMICONDUCTOR SWITCH FAILURE CONTROL CIRCUIT

BACKGROUND OF THE INVENTION

The present invention relates in general to a circuit coupled between a semiconductor switch and a load for interrupting power to the load upon failure of the semiconductor switch. More particularly, the failure control circuit is particularly adapted for use with a bilateral switch such as a Triac.

Various types of circuits exist for detecting a fault condition associated with the load. However, most of these circuits are quite complex and involve substantial additional circuitry for the detection of one or more conditions associated with the load.

Accordingly, one object of the present invention is to provide an extremely simple means for detecting a fault condition at a load, and in particular when the load is driven from a switchable semiconductor device, especially a bidirectional device such as a Triac.

U.S. Pat. No. 4,252,252 shows a control circuit for controlling a dispensing machine which includes as one component thereof, a solenoid driven from a Triac. It has been found that the Triac failed usually only in one direction at a time and typically failed by shorting thus in effect applying continuous voltage to the load. Where the solenoid controls water flow in a dispensing machine, it is extremely critical that such failure not occur as substantial water damage will be the result. The Triac shorting can occur in many different ways. For example, the Triac that is subjected to a destructively high di/dt generally shorts when MT2 is positive. Also, an excessive off-state voltage, backed by large current, may cause a short in either direction, but seldom in both directions simultaneously. This shorting failure essentially causes a substantially d.c. voltage across the load. When the load is an electromechanical device such as a solenoid, there may even be a fire hazard with such d.c. saturation.

Accordingly, one object of the present invention is to provide a simple circuit for use between a Triac or the like and a load for interrupting power to the load upon failure of the Triac, and in particular failure in the form of a permanent short in one direction.

SUMMARY OF THE INVENTION

In accordance with the present invention, there is provided a circuit for interrupting power to a load, such as a solenoid or the like. This circuit is for use with a semiconductor bilateral switch such as a Triac which has at least one input control electrode and an output electrode coupling to the load. The circuit of the present invention interrupts power to the load in the event of a unilateral failure of the switch. The circuit comprises energy storage means and means for coupling the energy storage means intermediate the semiconductor switch and load. The energy storage means is responsive to a d.c. voltage occasioned by the failure to cause opening of the path to the load to thus interrupt power to the load. In the preferred version, the energy storage means simply comprises a single capacitor. This capacitor is preferably a non-polar, electrolytic capacitor. In an alternate embodiment of the invention, two polar capacitors may be employed connected in series between the Triac and the load. In still a further version, two series-arranged polar capacitors have oppositely poled diodes thereacross. It has been found in accordance with the invention that the value of the capacitance that is employed is preferably within a predetermined range. The capacitance is preferably sufficiently large so as to have an inconsequential effect during normal operation and yet is preferably not too large as to become too expensive or to require too much of a delay period before the system halts operation. With a source voltage of 110 VAC, the preferred range for capacitance is 10–100 mfd. When the source voltage is 220 VAC, then the preferred range for capacitance is 5–50 mfd.

BRIEF DESCRIPTION OF THE DRAWINGS

Numerous other objects, features, and advantages of the invention should now become apparent upon a reading of the following detailed description taken in conjunction with the accompanying drawing, in which.

DETAILED DESCRIPTION

Figure 1:
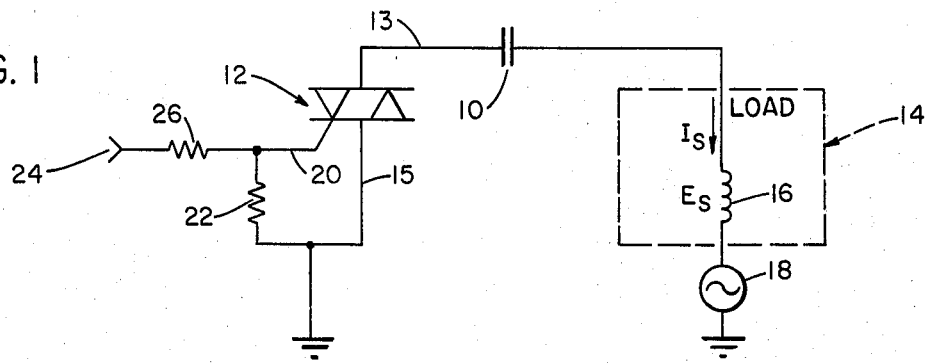
FIG. 1 is a preferred embodiment of the interruption circuit of this invention shown used with a Triac as the semiconductor switch and a solenoid as the load.

FIG. 1 shows the simplest version of the present invention in the form of a non-polar electrolytic capacitor 10 coupled in series between the Triac 12 and the load 14. The load 14 is shown in the form of a coil 16 which may be part of a solenoid. The other side of the coil 16 couples to the a.c. power source 18. The Triac 12 has main electrodes 13 and 15 and a control electrode 20. One of the main electrodes 13 couples to the capacitor 10 while the other main electrode 15 couples to a common ground. A resistor 22 is also shown coupling to the common ground from the control electrode 20. An input signal may be provided to the input terminal 24 coupled by way of resistor 26 to the control electrode 20. With regard to the Triac 12, identical reference characters are employed in FIGS. 2 and 3.

By selecting the value of the capacitance of capacitor 10 sufficiently large, its impedance will thus be sufficiently small so as to not materially affect the power delivered to the load via the Triac 12 under normal operating conditions. Or, in other words, the power that is dissipated in the capacitor 10 is small in comparison to the power delivered to the load. However, when a fault occurs by virtue of a undirectional shorting of the Triac 12, there is essentially a d.c. voltage applied at the electrode 13, causing capacitor 10 to charge at a time constant dependent at least upon the capacitance and the inductance of coil 16. When the capacitor is fully charged, then the current decreases to essentially zero and there is no longer a sustaining current for the solenoid coil. This, thus, causes an interruption of power to the load. In the case of the solenoid operating a flow of water, this would interrupt water flow and prevent possible serious damage.

As previously mentioned, the load which is desired to be protected is most often a solenoid operated water control valve. For example, Jet Spray Valve No. 858-126-1 is adapted for operation at 120 VAC with a 60

Hertz coil. The coil has 600 ohms d.c. resistance and approximately two henries of inductance. The coil draws approximately 100 milliamps at 120 volts. Assuming a selection of a series capacitor 10 at a value of 3 microfarads, because of a resonance or near resonance condition, the coil voltage rises about 35 percent above the applied circuit voltage. Thus, this is one value of capacitance that is to be avoided. If a capacitance of half that value or 1.5 mfd. is selected, the line and coil voltages are substantially equal but this is again an undesirable range for the capacitance because as the capacitance becomes too small the impedance presented by the capacitor becomes too large and thus interrupts the normal operation of the circuit. With increasing capacitance on the high side of resonance, the reactive VA of the capacitor decreases rapidly at first and finally linearly, when the resonant frequency is substantially less than 60 Hertz. Generally, the size and cost increase with increasing capacitance for a number of reasons. Perhaps the most important reason for this increase in price is the d.c. blocking requirement, necessary in the present application when the Triac has a half-wave short.

As previously indicated, the circuit of this invention is particularly adapted for use with a dispensing machine. In this case, the worst case half-wave short might occur in an overnight situation where such an equipment failure could escape notice for a long period of time. One capacitor that has been used is a non-polar, electrolytic motor starting capacitor which has a 150 volt d.c. blocking voltage for ten hours. As previously indicated, the preferred capacitance for the 110 VAC application is in the range of 10–100 microfarad, although a somewhat smaller capacitance could be used. When employing a 100 microfarad capacitor with the solenoid drawing 100 milliamps half time, because of the half-wave short, the capacitor charges initially at a rate of about 500 volts per second.

In the Jet Spray Dispensing Machine for 240 volt 60 Hertz applications, a widely used solenoid control valve is the Singer valve No. 858-222-1. For the purpose of making experimental measurements, this solenoid is connected in series with a 220 volt 60 Hertz source and a capacitor decade box. With this arrangement, the following data was obtained:

| C | $E_s$ | $I_s$ |
| --- | --- | --- |
| 0.1 | 50 | 9.8 |
| 0.2 | 112 | 21.9 |
| 0.3 | 220 | 36.4 |
| 0.4 | 270 | 44.7 |
| 0.5 | 290 | 48.5 |
| 0.6 | 300 | 50.4 |
| 0.8 | 300 | 50.4 |
| 1.0 | 285 | 48.1 |
| 2.0 | 260 | 42.4 |
| 3.0 | 240 | NA |
| 5.0 | 232 | 38.9 |
| 8.0 | 230 | 37.4 |
| 10.0 | 227 | 36.8 |

Where C is in microfarads; $E_s$ is coil voltage and $I_s$ is coil current in milliamps.

It can be seen from the above table that a resonance occurs at a capacitance of approximately 0.7 microfarad with the coil inductance being approximately 10 henries. The overall impedance calculates at 5.6 k ohms; the DC resistance is 3.2 k ohms; and Q is approximately 1.4.

In accordance with the preferred embodiment of this invention, it is desired to select the capacitance so as to avoid the resonance condition which subjects the solenoid coil to an excessive voltage. The overvoltage requires a coil differing from the one used on unprotected circuits and thus for the purpose of retrofitting in the field, it is desirable to select a capacitance corresponding to a value above resonance. Actually, it is preferred that the capacitor be considerably larger than its value at resonance. In some applications, this may preclude the use of electrolitic capacitors. However, capacitance values even down to 0.3 microfarad have been employed without providing coil damage and without adversely affecting normal circuit operation, without failure.

Figure 2:
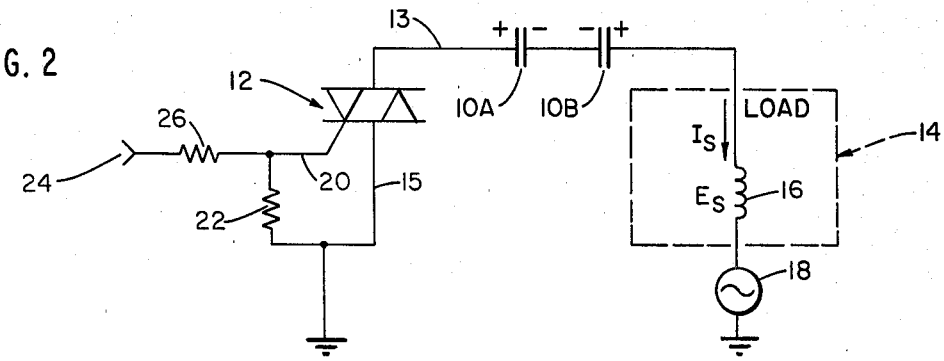
FIG. 2 is an alternate embodiment wherein the single capacitor is replaced by two series-connected polar capacitors connected in opposite polarity.

As mentioned previously, one capacitor that has been employed is a motor starting capacitor with non-polar aluminum electrolitic elements. The capacitor has a high current carrying capability. These capacitors can also be employed in pairs as depicted in FIG. 2 which shows the Triac 12, and load 14. Intermediate the Triac and load are the two capacitors 10a and 10b which in the embodiment of FIG. 2 are both polar capacitors connected in opposite polarity. Similarly, two non-polar electrolitic type capacitors could be used such as the spray type 500D 10 microfarad capacitor rated at 200 volts. With these capacitors connected back to back, there is a total capacitance of 5 microfarads. However, with a line voltage of 240 volts, it may be desirable from a safety standpoint to have a capacitor rated at 300 volts or more as such voltage could be generated by a half wave Triac short.

Figure 3:
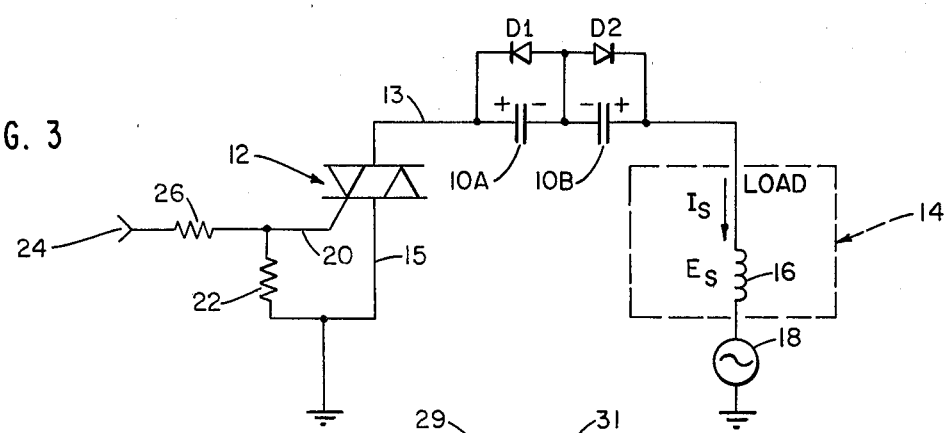
FIG. 3 is still another alternate embodiment employing the two series-connected polar capacitors with diodes connected thereacross.

FIG. 3 shows still another embodiment of the invention substantially identical to the one shown in FIG. 2 including capacitors 10a and 10b having diodes D1 and D2 respectively connected thereacross. The diodes are employed for the suppression of inverse voltages but for some applications may be unnecessary. Usually, the capacitor has a sufficient reverse leakage to prevent inverse voltage and thus the capacitor in a sense is self-rectifying with no additional diodes being necessary in most cases.

Once the Triac has short-circuited in one direction, it is then vulnerable to the effects of a subsequent short in the other conduction direction. Thus, to be completely safe, means are provided, as exemplified in FIG. 4, to shut the system down, or at the very least to provide a warning upon the occurrence of the first failure, which is usually a uni-directional failure.

Figure 4:
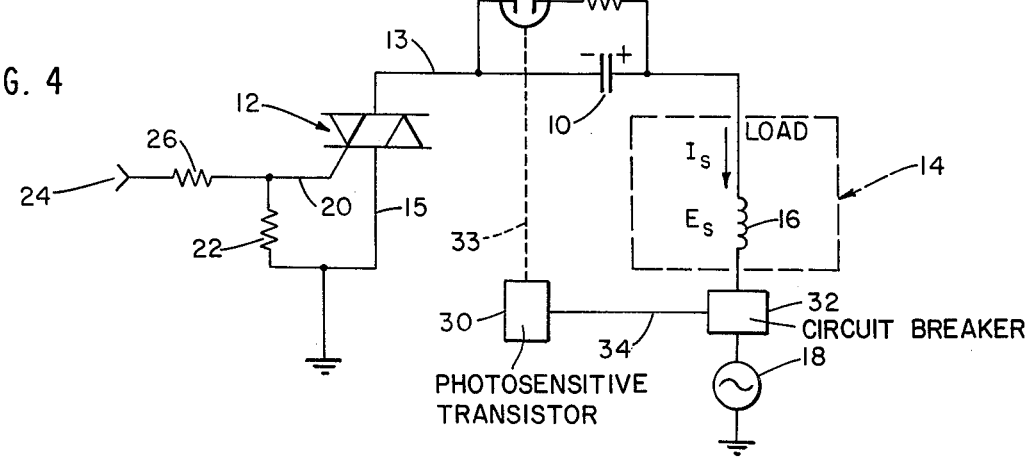
FIG. 4 shows another version employing a fault signal and means for interrupting source power.

In FIG. 4 the same reference characters are used to describe the Triac 12, the load 14, and the power source 18. In FIG. 4 the warning device is shown by a type NE-2 neon bulb coupled in series with resistor 31 which is preferably a 47K ohm resistor. Both the bulb 29 and the resistor 31 are connected in parallel with the blocking capacitor 10. During normal operation between the Triac and the load, there is insufficient voltage across the capacitor 10 to cause the bulb or lamp 29 to ignite. This is because the voltage is in an alternating state across the capacitor 10 and is not able to charge sufficiently in any one direction. However, when one section of the Triac shorts, the large DC voltage generated will cause ignition of the lamp and thus cause the lamp to glow. This thus functions as a warning device.

FIG. 4 also illustrates the automatic shut-down feature of this invention. In FIG. 4 there is also shown a circuit breaker 32 coupled in series with the source and capable of interrupting the source power to the load. The circuit breaker 32 is shown coupled by way of line 34 to the photosensitive transistor 30 shown simply as a block in FIG. 4. The dotted line 33 represents the light sensing path between the bulb or lamp 29 and the photosensitive transistor 30. The transistor 30 is, of course, also provided with biasing resistors so as to properly operate it when in receipt of light from the warning device 29. Thus, upon occurrence of a failure and the signalling thereof by ignition of the neon bulb 29, the photosensitive transistor 30 is caused to be operated, usually into conduction, and this signal is coupled on line 34 to the circuit breaker 32 to open the path between the source and the load.

What is claimed is:

1. For a semiconductor bilateral switch having at least an input control electrode and an output electrode coupling to a load and an AC source intercoupling the bilateral switch and load means for interrupting power to the load in the event of a unilateral failure of the switch comprising, energy storage means and means coupling the energy storage means intermediate the semiconductor bilateral switch and load, said energy storage means responsive to a unilateral failure of the bilateral switch to thus couple uni-polarity voltage thereto to cause opening of the path to the load to thus interrupt power to the load.

2. Means as set forth in claim 1 wherein the energy storage means includes a capacitor.

3. Means as set forth in claim 2 wherein the capacitor is a non-polar capacitor.

4. Means as set forth in claim 2 wherein the capacitor comprises a pair of series connected polar capacitors coupled in opposed polarity.

5. Means as set forth in claim 4 including a diode coupled across each capacitor.

6. Means as set forth in claim 2 wherein said capacitor is selected with a value to provide operation above resonance.

7. Means as set forth in claim 1 including a warning device responsive to the DC voltage across the energy storage means to signal the bilateral switch failure.

8. Means as set forth in claim 7 wherein the warning device includes a visual warning device.

9. Means as set forth in claim 8 including means responsive to the warning device being activated for interrupting power from a power source.

10. Means as set forth in claim 7 wherein the warning device includes a neon bulb connected across the energy storage means.

11. Means as set forth in claim 10 further including a power source and means responsive to the warning device being activated for interrupting power from the power source.

12. Means as set forth in claim 11 including photosensitive means responsive to the warning device and circuit breaker means responsive to the photosensitive means for interrupting power.

13. Means as set forth in claim 1 wherein said energy storage means comprises capacitance means charged by said uni-polarity voltage to open said path over a charging period of said capacitance means until said path is fully open with no further current coupled to the load.

14. Means as set forth in claim 1 wherein said storage means comprises capacitance means charged by said uni-polarity voltage to open said path over a charging period of said capacitance means.

* * * * *